United States Patent [19]
McDermott

[11] Patent Number: 5,039,950
[45] Date of Patent: Aug. 13, 1991

[54] MULTIPLE CLOCK SYNTHESIZER

[75] Inventor: Bruce C. McDermott, Penfield, N.Y.

[73] Assignee: Eastman Kodak Company, Rochester, N.Y.

[21] Appl. No.: 382,368

[22] Filed: Jul. 20, 1989

[51] Int. Cl.$^5$ .................... H03K 17/00; H03K 5/13
[52] U.S. Cl. ......................... 328/62; 307/269; 377/77; 377/78; 328/63; 328/72
[58] Field of Search ............... 377/77, 78, 75, 76, 377/37, 56, 72, 80; 328/62, 63, 72; 307/269, 480

[56] References Cited

U.S. PATENT DOCUMENTS

| | | | |
|---|---|---|---|
| 4,124,898 | 11/1978 | Munter | 307/269 |
| 4,171,517 | 10/1979 | Higa et al. | 307/269 |
| 4,328,588 | 5/1982 | Smithson | 307/269 |
| 4,713,623 | 12/1987 | Mower et al. | 307/269 |

Primary Examiner—Timothy P. Callahan
Attorney, Agent, or Firm—Edward Dugas

[57] ABSTRACT

The synthesizer of the present invention is a multiple clock synthesizer for generating multiple clock signals with improved clock width and position accuracy. Within the synthesizer an oscillator provides a train of pulses corresponding to a base signal. A plurality of delay devices, formed of differing lengths of cables, are coupled to the oscillator with each cable providing a different delay to the train of pulses to in turn provide a plurality of delayed clocking signals. A plurality of registers, each having, a clocking input, a plurality of output taps, and load inputs and corresponding in number to the plurality of delay devices receive on their clocking inputs a delayed clocking signal from an associated one of the plurality of delay devices. A binary number is circulated in each of the plurality of registers as a function of the associated clocking signal to provide at their outputs a sequence of pulses each having a leading edge displacement defined by 1 divided by the number of outputs from the plurality of delay devices, times the number of outputs per register, times the element clock period. The number of outputs in the clock delay section corresponding to the number of register used.

4 Claims, 10 Drawing Sheets

MULTIPLE CLOCK SYNTHESIZER

BACKGROUND OF THE INVENTION

1. Field of the Invention

The present invention relates to the field of digital clock signal synthesizers and, more particularly, to a synthesizer for generating multiple clock signals with improved clock pulse width and position accuracy.

2. Description of Related Art

Various systems require accurate multiple clock signals. One particular system is an imaging system that incorporates a CCD imager that has to be scanned (activated) using multiple clock signals to read out lines of charges that are a function of an image. As the frequency (speed) of operation of CCD imaging systems increase, the performance demands placed on the digital logic associated with such systems increases proportionately. Edge positioning accuracy and adjustability for clocking the CCD and operating the associated signal processing becomes critical. These adjustments are required to optimize and compensate for, clock driver performance, CCD imager or performance, and to optimize the signal processing signal to noise ratio.

One prior art approach to a synthesizer logic design for high speed CCD imager systems, is illustrated in FIG. 1. Digital counters 11, 12 and 13 are used to develop address information for elements (pixels) within a line based on an oscillator signal from an element rate oscillator 10. A fast pulse section 30 is formed with delay circuits 1-4. Each delay circuit is comprised of a selectable digital delay A, a selectable digital delay B and a NAND gate 19. That are used to control the pulse width and the position of the pulse within an element scan cycle, and to position the pulses in relation to each other. This prior art approach works, however it contains many components (requiring, for example, two digital delays A and B per clock generated), with each component consuming power.

SUMMARY OF THE INVENTION

In a preferred embodiment of the invention, there is provided a multiple clock synthesizer having an oscillator for providing a train of pulses corresponding to a base signal along with a plurality of delay devices coupled to said oscillator means each providing a different delay to said base signal to provide a plurality of delayed clocking signals and a plurality of registers each having, a clocking input, a plurality of output taps, and loading inputs and corresponding in number to the plurality of delay devices each of the registers receiving on its clocking input a delayed clocking signal from an associated one of the plurality of delay devices, and on it loading inputs a binary number which is circulated in each of the plurality of register means as a function of the associated clocking signal to provide at the output taps a sequence of pulses each having a leading edge displaced by an increment of time corresponding to one divided by the number of shift registers times the number of output taps per register times the element clock period.

From the foregoing, it can be seen that it is a primary object of the present invention to provide an improved architecture for synthesizing high resolution and high accuracy clocks.

It is another object of the present invention to provide a multiple clock synthesizer architecture having low cost and power consumption.

It is yet another object of the present invention to provide a multiple clock synthesizer architecture that has a digital resolution defined as a function of the number of outputs in the clock delay section, times the number of shift registers, and the number of outputs per shift register.

Another object of the present invention is to provide a clock synthesizer having selectable, synchronous outputs for clock waveform construction.

These and other objects of the present invention will become more apparent when taken in conjunction with the following description and drawings, wherein like characters indicate like parts and which drawings form a part of the present disclosure.

DESCRIPTION OF THE PREFERRED EMBODIMENTS

Figure 1:
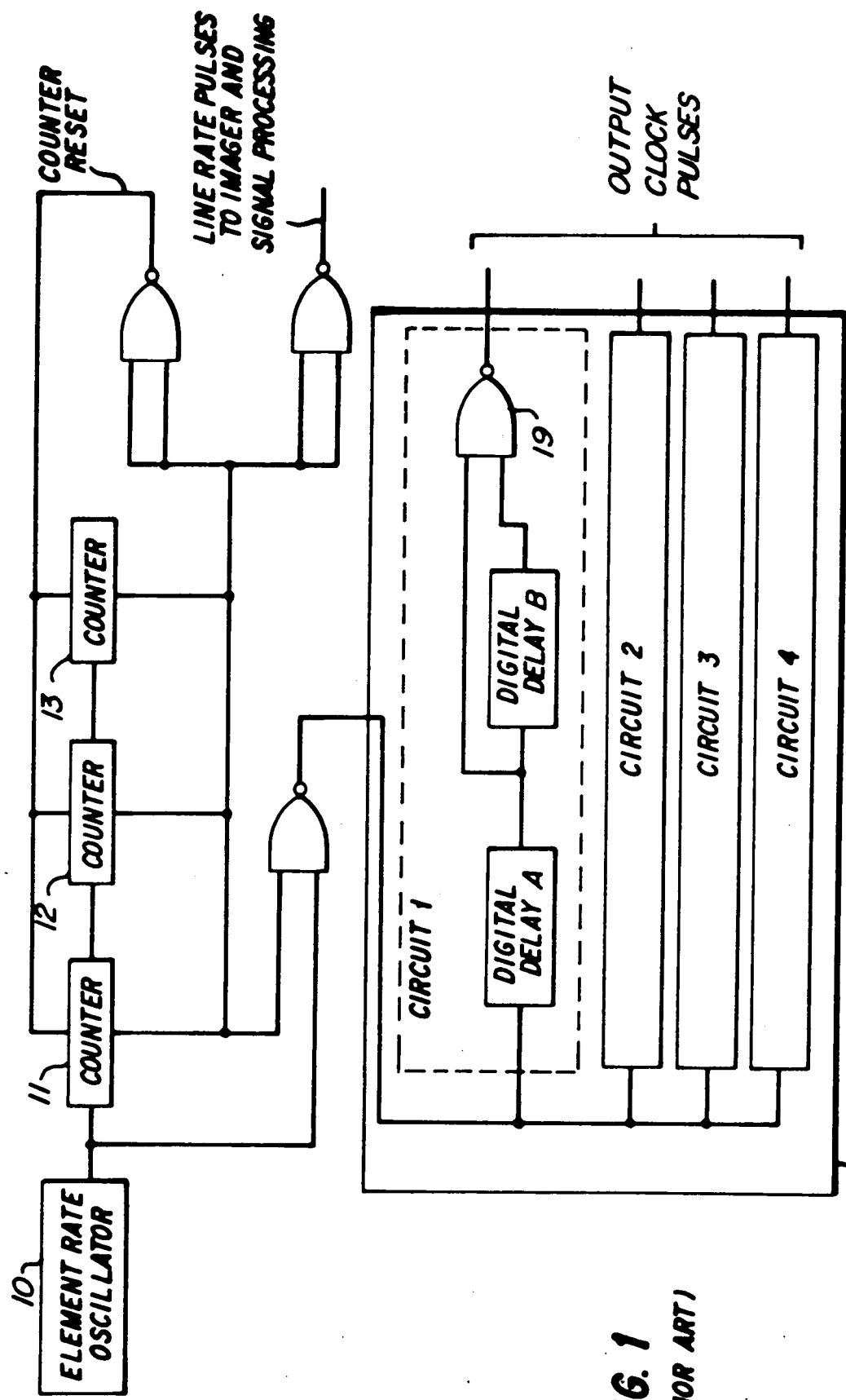
FIG. 1 is a logic block diagram of a prior art multiple clock synthesizer.
Figure 2:
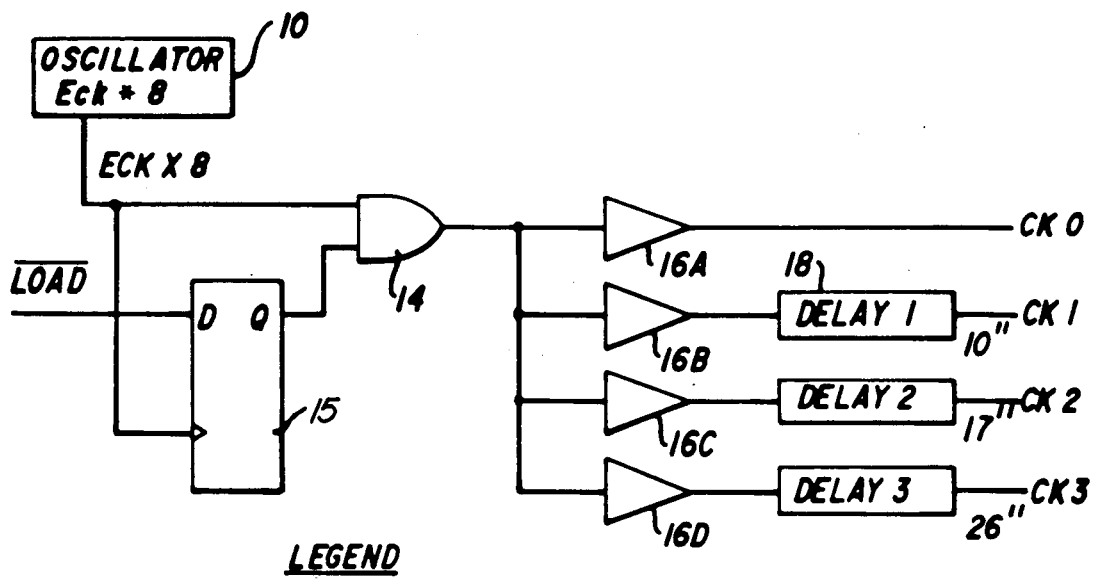
FIG. 2 is a logic block diagram of a clock delay circuit with an oscillator which is part of the present invention.
Figure 3:
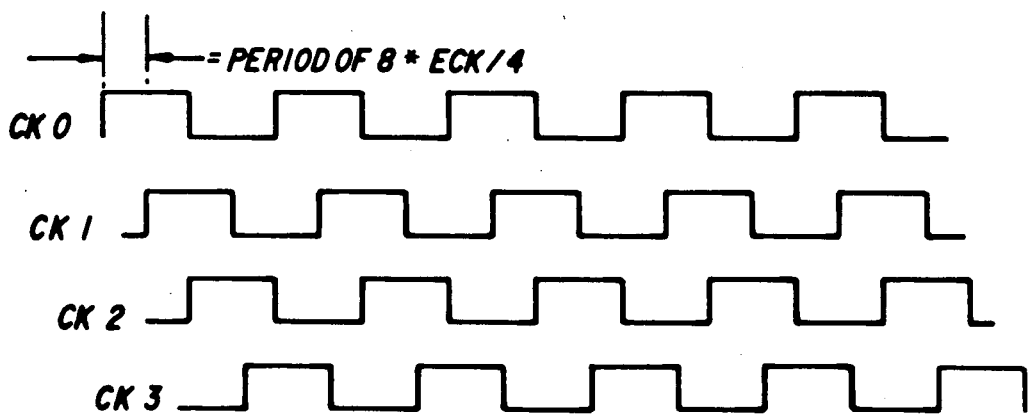
FIG. 3 illustrates a group of clock signals (CK0-CK3) generated by the clock delay circuit of FIG. 2.

Referring to FIG. 2, an oscillator 10 provides a signal having a rate that is eight times the rate ECK of the device to which the present invention is to service. In the preferred embodiment of the invention, the ECK rate was 30 megahertz therefore, 8×30 MHz equals an oscillator ratio of 240 MHz. The signal from the oscillator 10 is coupled to an input of an AND gate 14 and to the toggle input of a D-type flip flop 15. The D-input of flip flop 15 receives a LOAD input signal. The Q output of flip flop 15 is connected to a second input to the AND gate 14. The output of AND gate 14 is connected to the inputs to a group of buffers 16A–16D. The output of buffer 16A is the clocking signal CK0. The outputs from each of the remaining buffers are delayed by associated delay circuits 18. In the preferred embodiment of the invention, delay 1 was set equal to a period of 8 times the element clock ECK divided by 4. The delay 2 was set equal to 2 times the delay of clock 1. The delay 3 was set equal to 3 times the delay of clock 1. The clocks provided by the delay circuits 1–3 are labelled CK1-CK3, respectively. FIG. 3 illustrates in a waveform diagram the relationship of the clocks CK0-CK3. Each clock is displaced from the preceding clock by one quarter of the total period of the base clock CK0. To achieve the high degree of accuracy necessary for the positioning of the leading edges of each of the clocks at exactly one quarter of the total period of the base clock, the delay circuits 18 are formed by using selected lengths of GORE wire-wrapable coax cable. The particular cable used was a 50 ohm cable bearing part number CXN-214 manufactured by W. L. GORE and Associates, 555 Papermill Road, Newark, Del. The cable length used for delay number 1 was 10 inches in length, for number 2, 17 inches, and for number 3, 26 inches.

The D-type flip flop 15 operates as a latch to control the starting and the stopping of the output pulse train appearing at the output of the AND gate 14 based on the existence of the load pulse signal LOAD/.

Figure 4:
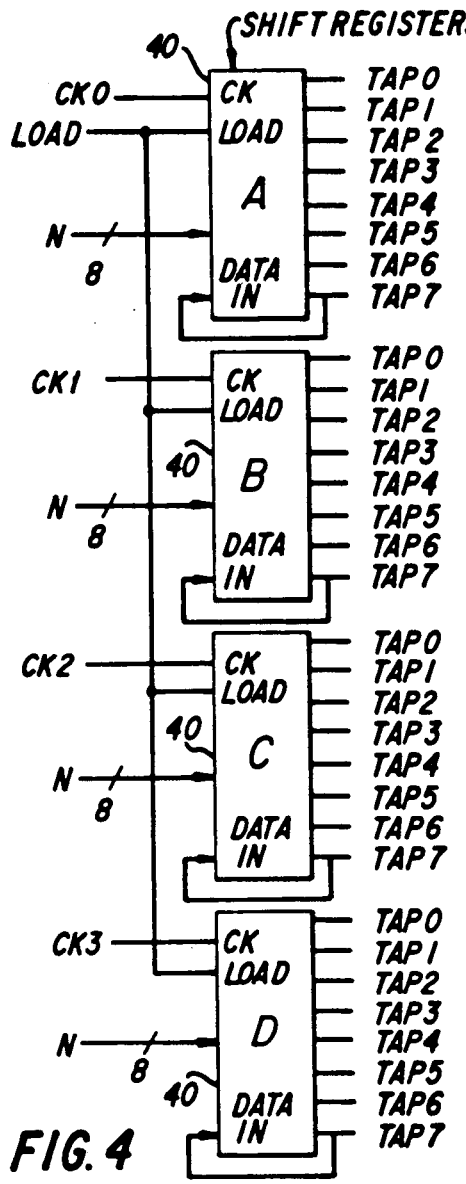
FIG. 4 is a logic block diagram illustrating one preferred embodiment of the present invention when incorporated with the clock delay circuit of FIG. 2.

Referring to FIG. 4, four eight bit shift registers 40 labelled A, B, C, D are shown receiving the clock signals CK0-CK3 on their respective clocking inputs labeled CK. In the preferred embodiment of the invention, the shift registers used were of the type manufactured by National Semiconductor under their part number F100141. These types of registers have a parallel load ability with parallel outputs, a serial shift through the register with a serial input, and the ability to be operated at relatively high clocking rates. The number 7 tap output of each shift register is fed back to the registers DATA IN terminal. The LOAD input terminals for each of the registers are connected together to receive the LOAD signal. An 8 bit input, parallel in form, denoted N is applied to each of the shift registers. A fixed integer "N" is loaded into each of the registers during, for example, a horizontal blanking time.

Figure 5:
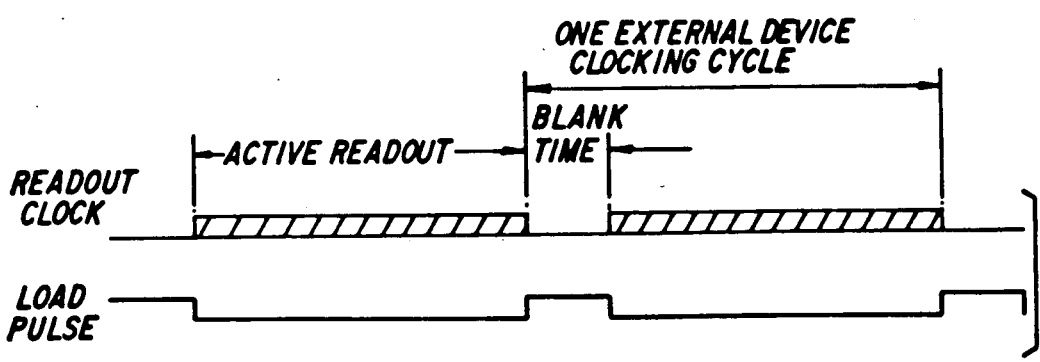
FIG. 5 illustrates the states of a pair of signals which states are useful in understanding the operation of the preferred embodiments of the invention.

FIG. 5 illustrates the timing relationship of the LOAD pulse to the availability for readout of legitimate clocking signals on the output of the shift registers. The positive LOAD pulse is shown occurring at a blank time in the total clocking cycle for the external device. The "N" value is serially shifted (recirculated) through each register based on the input clocks during the active readout portion of the clocking cycle. The registers are wired so that the valve "N" serially recirculates through the registers. The parallel outputs of each of the registers are labelled TAP 7-TAP 0, corresponding to the most significant bit through the least significant bit, respectively.

Figure 6:
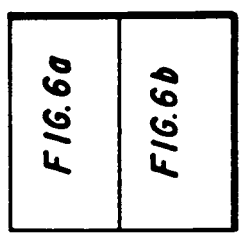
FIG. 6 is a map illustrating the correct orientation of FIGS. 6a and 6b.
Figure 6A:
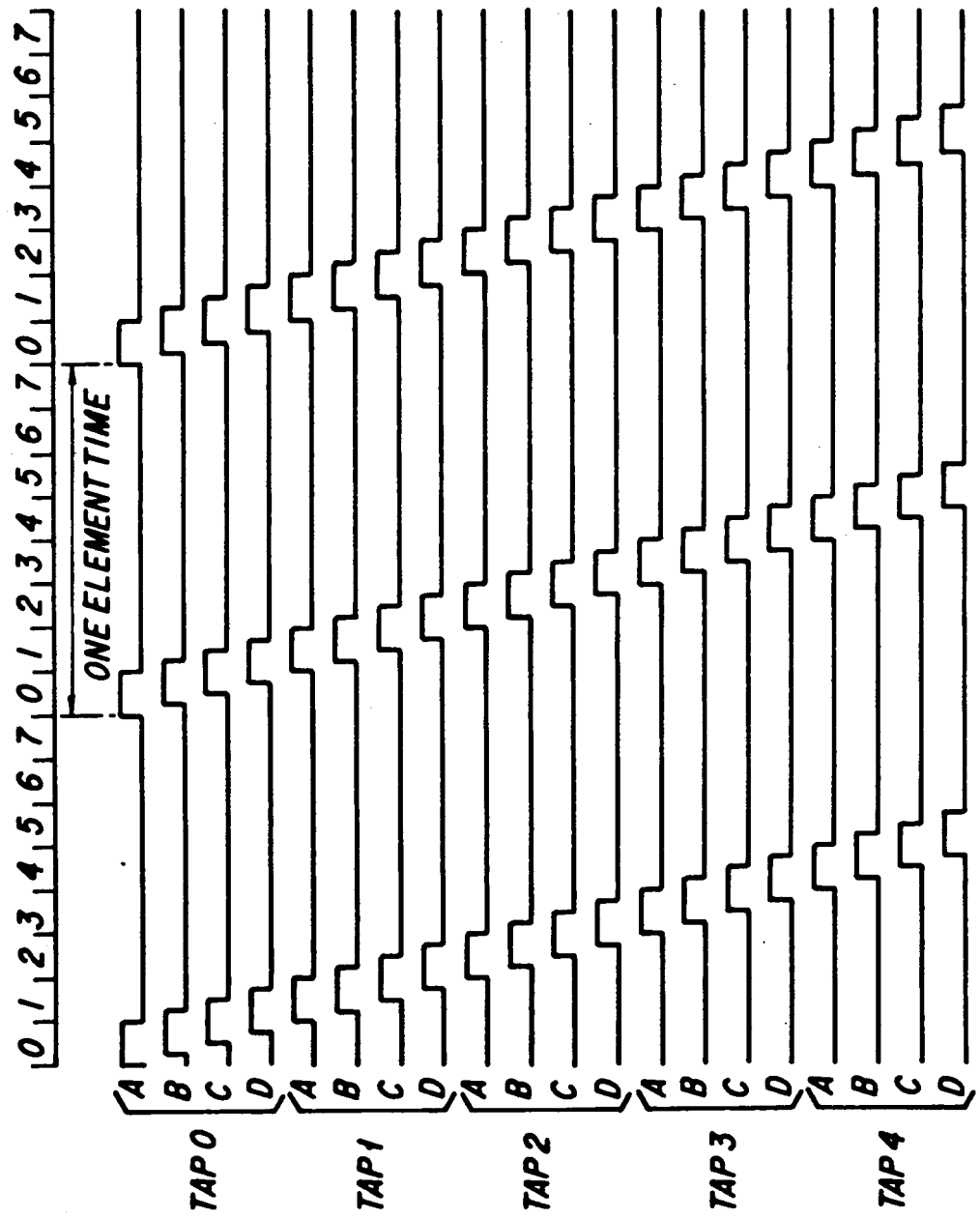
FIGS. 6a and 6b illustrate a timing diagram of the multiple clock output signals from the preferred embodiment shown in FIG. 4.
Figure 6B:
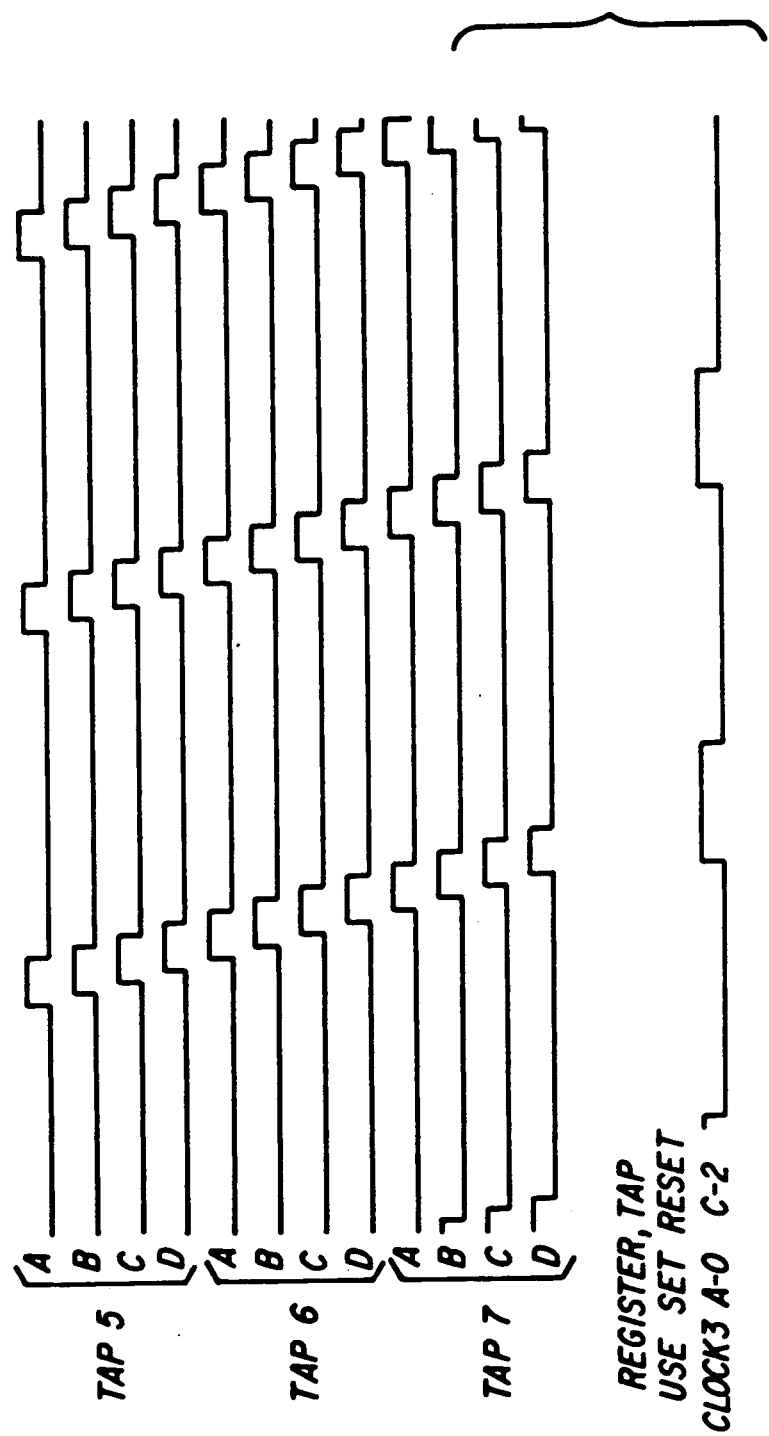

FIGS. 6a and 6b assembled according to the map of FIG. 6 illustrates the waveforms present at each of the TAPS of each of the shift registers for an "N" integer value of 00000001 (binary). As noted, the leading edge of each successive tap output, is displaced, exactly one 32'nd of an element time. For the particular clocking cycle of the external device, it can be seen that for every 1/32'nd of an element time there is a pulse commencing a 0 to 1 transition existing at one of the taps of the four shift registers.

In order to generate desired output waveforms, the outputs of the shift registers may be logically combined as per the example shown at the bottom of FIG. 6b, to generate a signal defined as CLOCK 3. With the timing of the leading edge and the falling edge of the desired signal clock 3 known, lines drawn upwards to the appropriate intersecting waveforms reveal that the leading edge can be fabricated from the signal on the 0 tap of the A register and for the reset the signal on tap 2 of register C will provide the proper timing.

Figure 7:
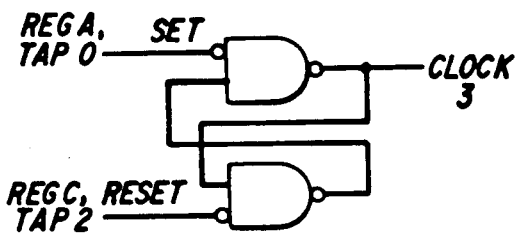
FIG. 7 is a logic circuit for a clock signal.

FIG. 7 illustrates a logical circuit which when connected to the appropriate taps, indicated by the previous example, will form at its output the desired signal CLOCK 3.

Figure 8:
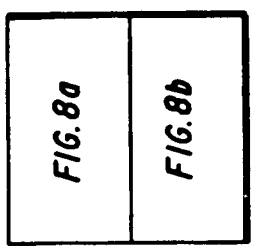
FIG. 8 is a map illustrating the correct orientation of FIGS. 8a and 8b.
Figure 8A:
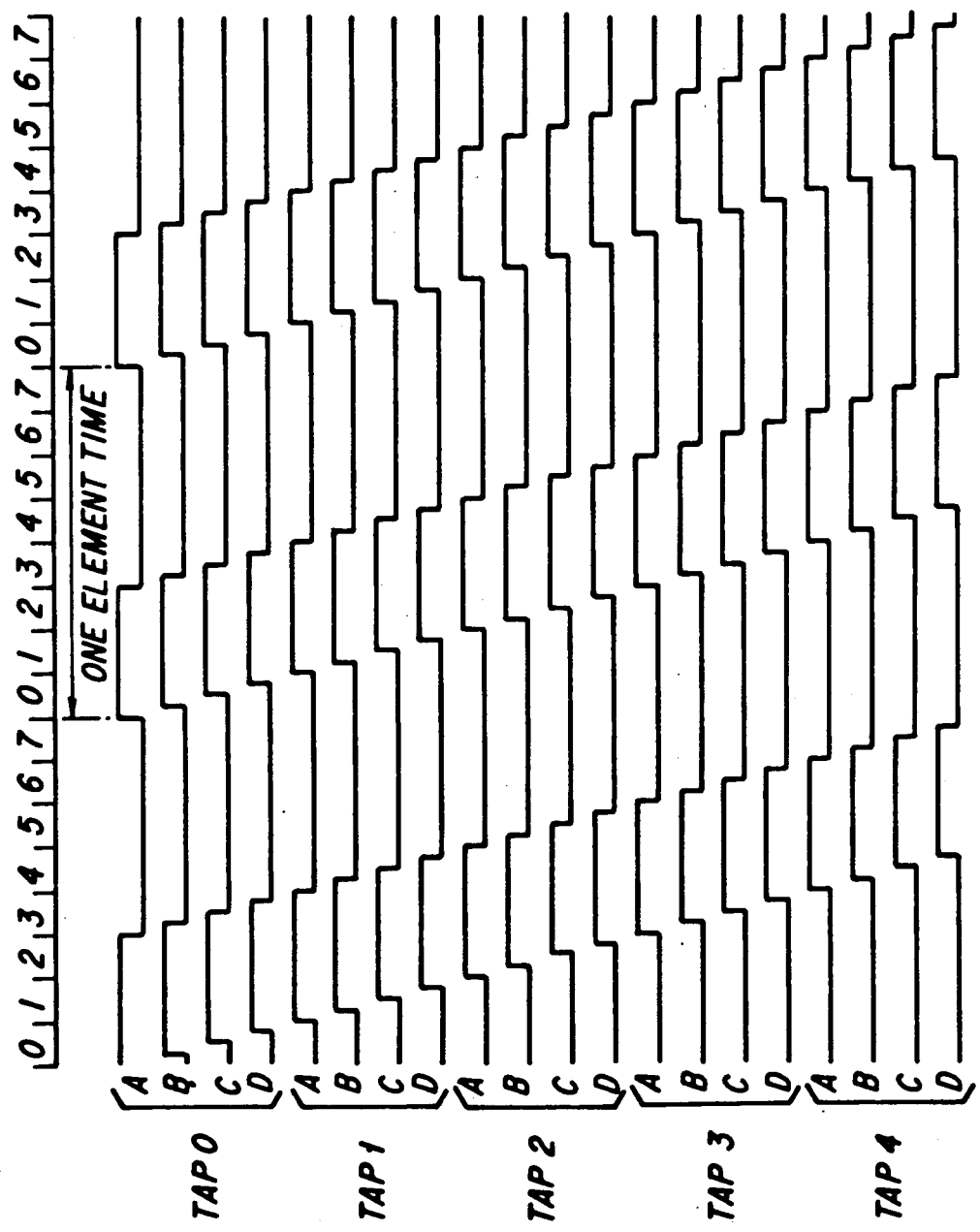
FIGS. 8a and 8b illustrate additional multiple clock signals possible from the embodiment of FIG. 4.
Figure 8B:
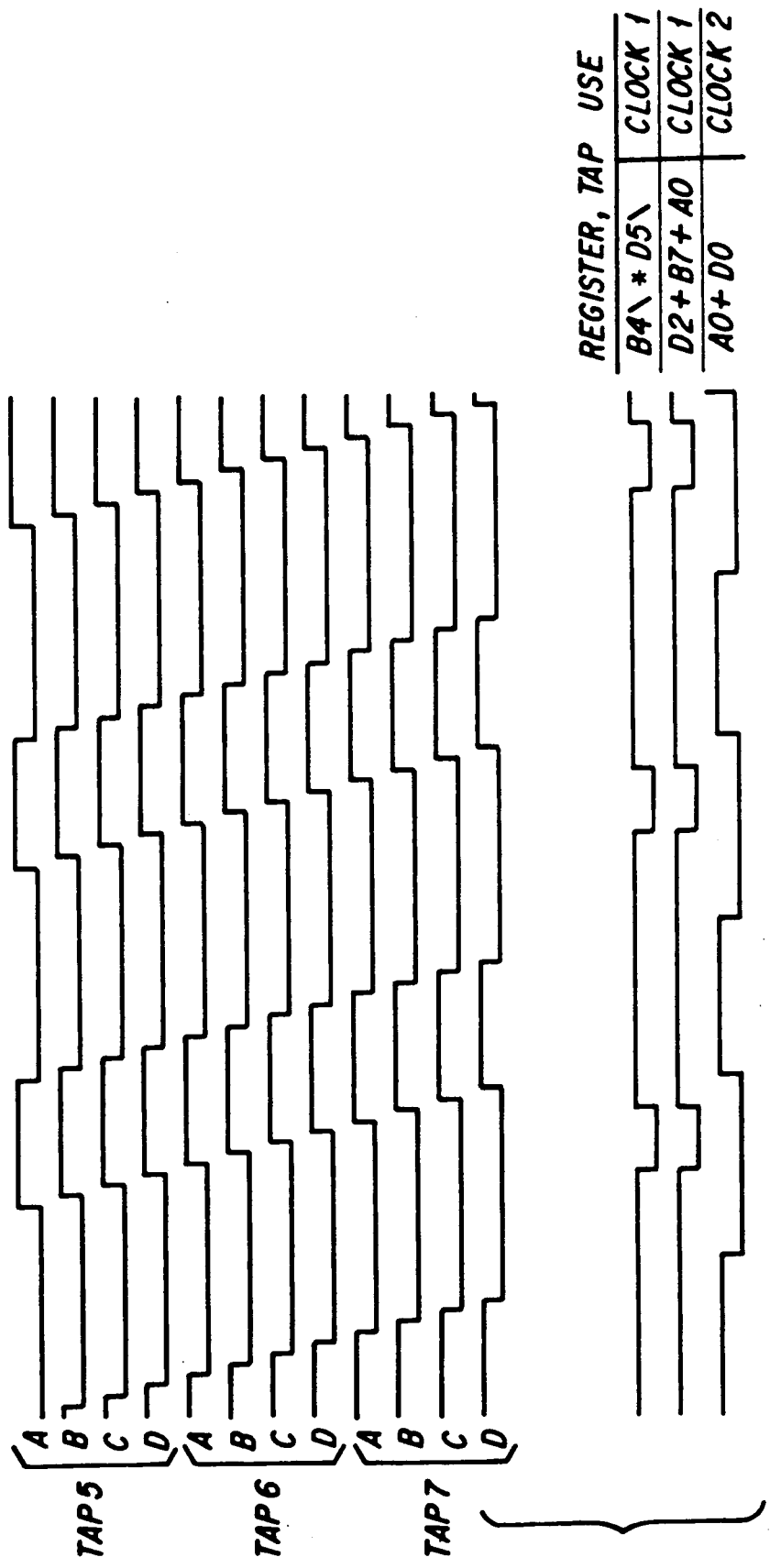

Referring now to FIGS. 8a and 8b assembled according to the map of FIG. 8, a group of waveforms appearing at the output TAPS 0-7 for each of the shift registers A-D is illustrated for the condition where the number N at the input of the shift register is 0000001111. In this instance, it is noted that the positive pulses are wider than those shown in FIG. 6a and 6b.

Figure 9:
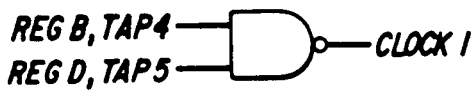
FIG. 9 illustrates a second logic circuit for forming a clock signal.

Referring now to the waveform shown after the TAP 7 waveforms and associated with the CLOCK 1 signal, by the process (described in connection with the preceding composite clocking signal), of taking the complement signal of register B's, TAP 4 and the complemented signal from register D's, TAP 5, the signal to CLOCK 1 is generated. A logic circuit for accomplishing this is shown in FIG. 9 with a NAND gate having the register B, TAP 4 signal as one input and the register D, TAP 5 input as the other signal. The output of the NAND gate is the CLOCK 1 signal.

In an identical manner, the waveform corresponding to the CLOCK 1 signal can be generated by ORing the signals from the D register, TAP 2, with the B register, TAP 7 signal and the A register, TAP 0 signal.

Figure 10:
FIG. 10 illustrates a third logic circuit for forming a clock signal.

A CLOCK 2 signal, corresponding to the waveform shown, can be achieved by ORing together the signal from the A register, TAP 0 and the D register, TAP 0. A logic circuit for performing that function is shown in FIG. 10 with an OR gate having the appropriate signals applied to its inputs to provide at its output, the CLOCK 2 signal.

Figure 11:
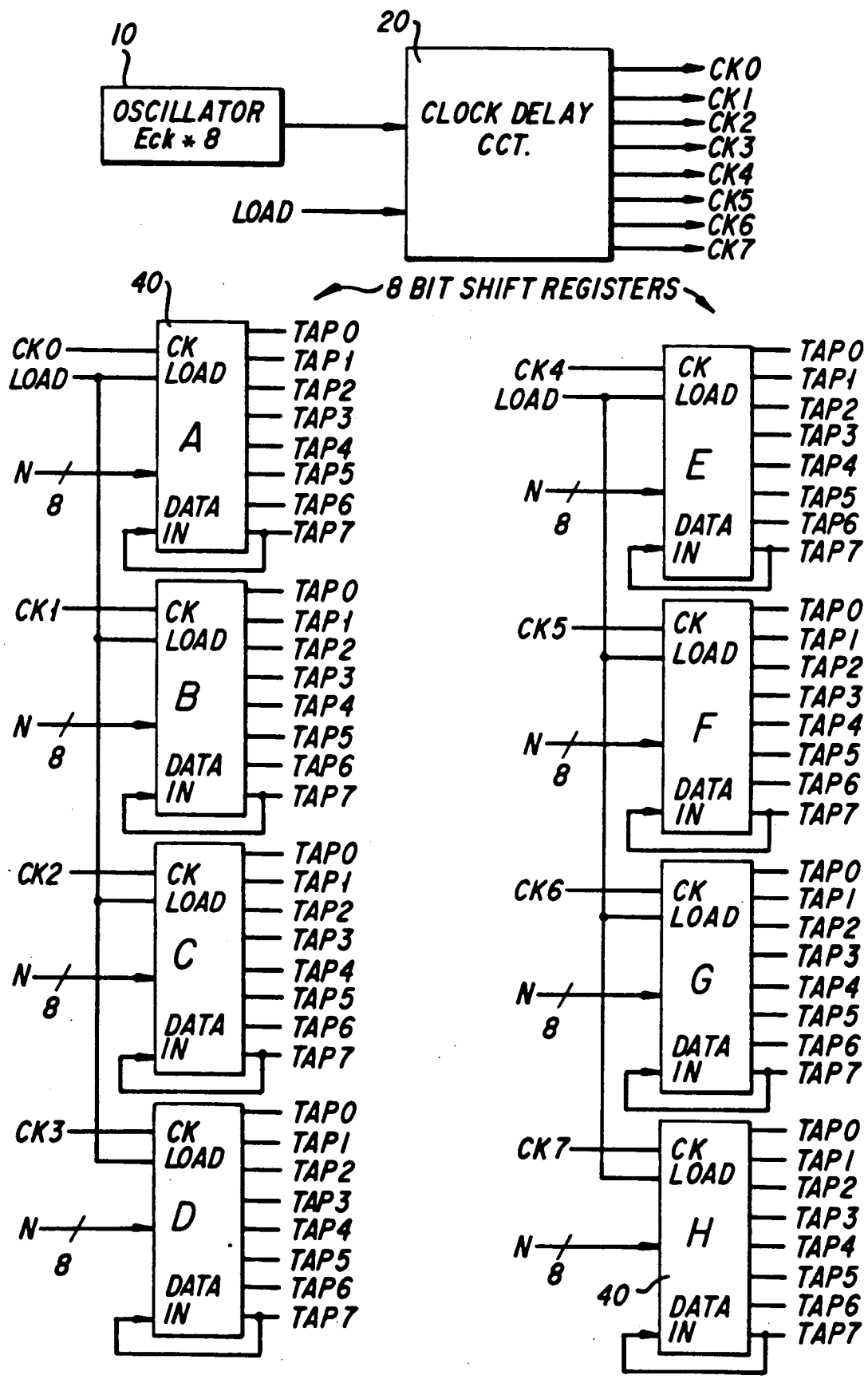
FIG. 11 is a logic block diagram illustrating a second preferred embodiment of the invention.

Referring to FIG. 11 wherein a second embodiment of the clock synthesizer of the present invention is illustrated with an oscillator 10 providing an output signal which is 8 times the basic clock ECK of the external device. The oscillator signal is applied to the clock delay circuit 20 along with the LOAD signal. The clock delay circuit 20 is provided with four additional delay lines to divide the pulse width of the oscillator output pulse into eight equally spaced intervals. In this instance, a total of 8 shift registers 40 are used, each receiving on its respective CK input one of the eight clocking signals from the clock delay circuit 20. The aforementioned circuit will provide twice the resolution as that achieved with the circuit of FIG. 4 which is one 64th of an element time. If the same resolution as FIG. 4 were desired it could be achieved by multiplying the external device clock by a factor of 4 instead of 8.

Figure 12:
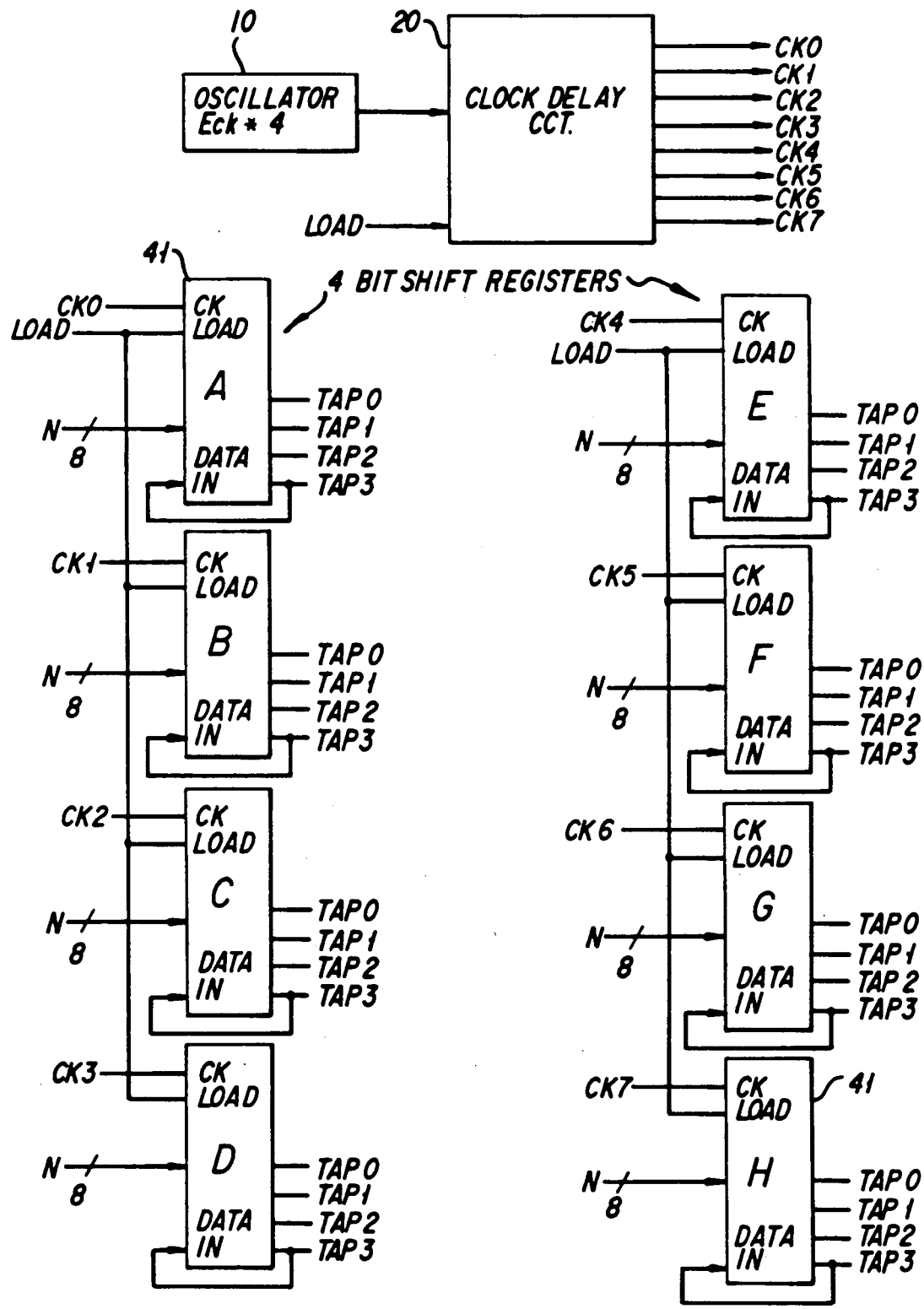
FIG. 12 is a logic block diagram illustrating a third embodiment of the invention.

Referring to FIG. 12 wherein a third embodiment of the present invention is shown, utilizing an oscillator 10 having a frequency which is 4 times the element clock rate with the clock delay circuit 20 receiving the signal from the oscillator 10 along with the LOAD signal to provide an 8 clock delay. Each delay equals the element rate times 4 divided by 8. In this particular circuit, 8 shift registers of the 4 bit type are used (re-wired 100141'S for example), such that the shift registers clock at 4 times the element rate and utilize four taps per shift register. At very high speeds this is desirable, since the limit of this type of circuit architecture is the clock rate of the shift registers.

Figure 13:
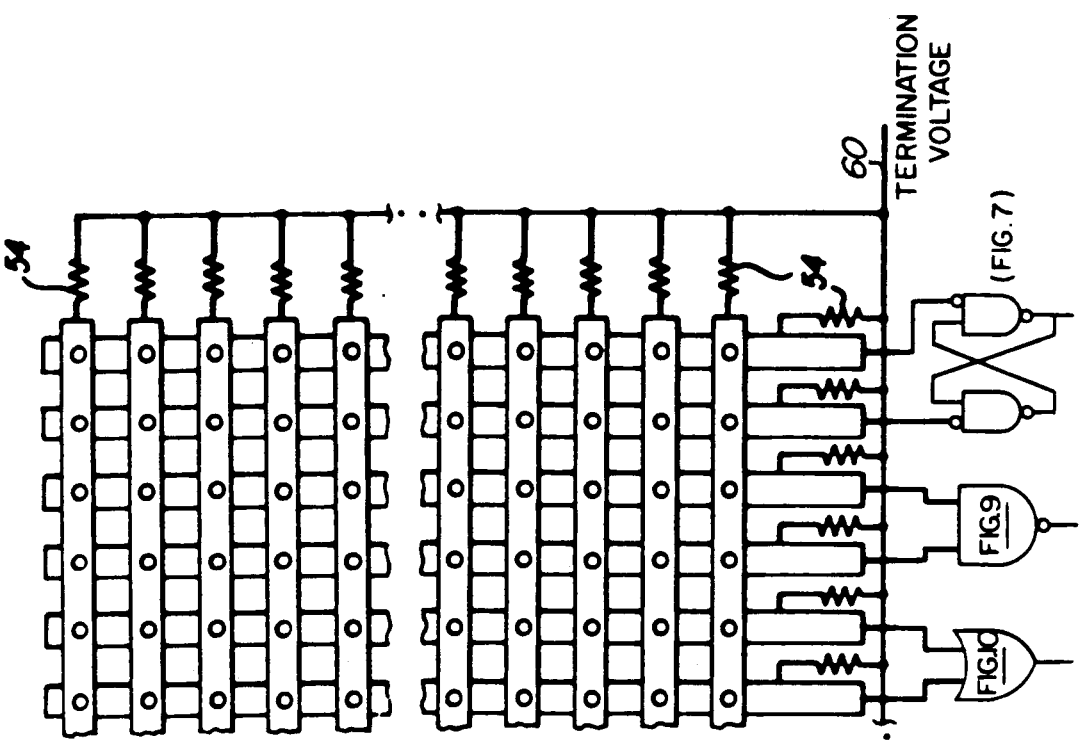
FIG. 13 is a schematic diagram illustrating a matrix which is connected to the outputs of the shift registers of the preferred embodiments and to the inputs of FIGS. 7, 9, or 10.

FIG. 13 illustrates the interconnection method that allows versatile system adjustment. It represents an interconnection matrix that is placed between the shift register outputs and the waveform creation logic; either flip-flops or logic gates. By selectively soldering wires at the x-y interconnection points, we choose the source clocks that drive the waveform creating logic.

Figure 14:
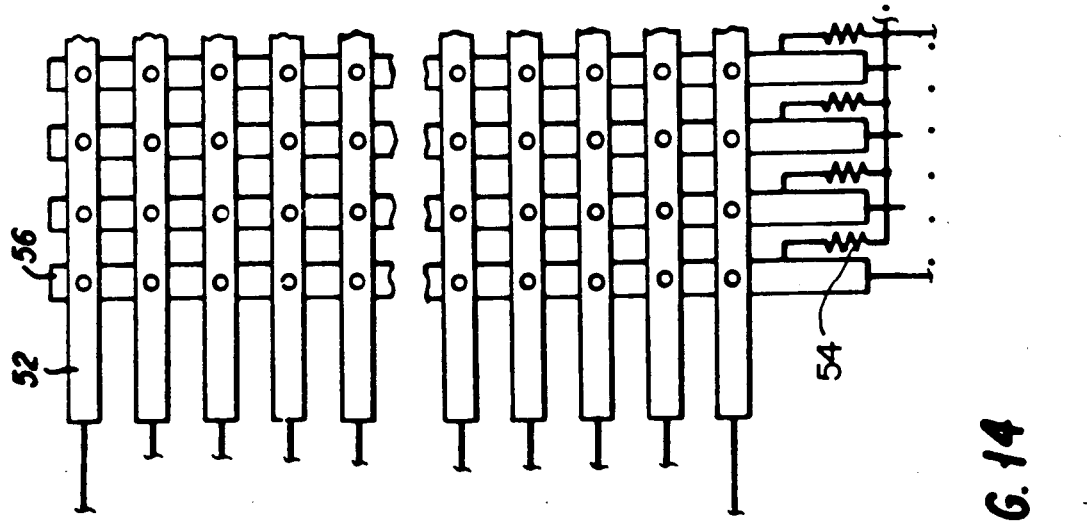
FIG. 14 is an enlarged cross-sectional view of a portion of the matrix of FIG. 13.
Figure 14:
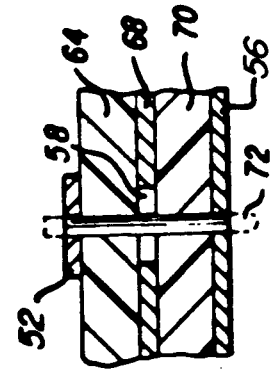

A matrix of traces 52 and 56 are designed to be of a controlled impedance. The traces 52 are the top traces and traces 56 are the bottom traces. Referring momentarily to FIG. 14, the top traces 52 are shown separated from the bottom traces 56 by means of an insulating layer 64, a conductive ground plane 68 and a second insulating layer 70. A hole extends through the traces and the insulating layer at the crossover points to enable a conductor 72 to be inserted into the hole such that one end of the conductor can be soldered to the trace 52 and the opposite end to the trace 56. A hole 58 through the ground plane 68 at each of the intersection points is sufficiently large so as to prohibit the conductor 72 from making contact with the ground plane when soldered in position. Selection of the particular traces to be connected together is determined by the clock waveforms desired, such that the signals appearing at the end of the traces 56 are connected, for example, to the logic gates of FIGS. 7, 9 and 10 for creating the desired output waveform. Termination resistors 54 are connected to the ends of each of the traces 52 and 56 and to a suitable termination voltage 60.

This invention contains four discrete sections. FIG. 2, the clock delay section, FIG. 4 or 11 (or 12), the shift register section, FIG. 13, the interconnection matrix, and FIGS. 7, 9, and 10, the output waveform creation section (logic).

The clock delay and shift register section creates a group of precisely positioned (in time) pulses that, in the case of FIG. 11 give us a resolution of 1/32 of an element time. (ECK)

The interconnection matrix, FIG. 13, provides a simple, practical way of choosing shift register outputs as sources for the waveform creating section (logic).

The waveform creation logic, FIGS. 7, 9, and 10, uses the shift register outputs (through the matrix) to create variable width and position clocks that are synchronously defined.

From the foregoing it can be seen that an adjustable multiple clock synthesizer having accurate clock width and position accuracy can be achieved by dividing the clock element period into precisely positioned segments, and that by increasing the number of shift registers used in the system, an increase in the resolution of the system is easily achieved. The present synthesizer requires less power, cost less and is stable along with being digitally defined and adjustable.

While there has been shown what are considered to be the preferred embodiments of the invention, it will be manifest that many changes and modifications may be made therein without departing from the essential spirit of the invention. It is intended, therefore, in the annexed claims, to cover all such changes and modifications as may fall within the true scope of the invention.

I claim:

1. A multiple clock synthesizer comprising:
    (a) an oscillator means for providing a train of pulses corresponding to the transitions of a base signal;
    (b) a plurality of delay means coupled to said oscillator means each providing a different delay to said train of pulses to provide a plurality of delayed clocking signals said plurality of delay means comprised of a buffer means having an input for receiving said train of pulses, and an output; and a length of cable, having a different length corresponding to its delay, with one end of said cable connected to the output of said buffer means and the other end connected to the clocking input of a respective one of a plurality of register means;
    (c) said plurality of register means each having, a clocking input, a plurality of output taps, and a loading input and corresponding in number to said plurality of delay means, each of said register means receiving on its clocking input a delayed clocking signal from an associated one of said plurality of delay means and on its loading input a load signal; and
    (d) a binary number which is circulated in each of said plurality of register means as a function of the associated clocking signal to provide at said output a sequence of pulses each having a leading edge displacement defined by 1 divided by the number of outputs of the plurality of delay means, times the number of outputs per register, times the element clock period with the number of outputs from the plurality of delay means corresponding to the number of registers used.

2. The multiple clock synthesizer according to claim 1 and further comprising:
    (a) interconnection matrix means connected to the output taps of said plurality of register means; and
    (b) waveform creating logic means connected to said interconnection matrix for receiving selected pulses from said plurality of register means and for logically combining said selected pulses to provide an output waveform.

3. The multiple clock synthesizer according to claim 2 wherein said interconnection matrix means is comprised of:
    (a) a first plurality of conductive traces each having a first end connected to the output tap of a respective one of said register mean;
    (b) a second plurality of conductive traces, each crossing the first plurality of conductive traces and having an end connectable to said waveform creating logic means wherein said first traces and said second traces are selectively interconnected to pass pulses from the output taps of said register means to the waveform creating logic means.

4. The multiple clock synthesizer according to claim 1 and further comprising:
    (a) a flip-flop having a data input, a toggle input and an output for receiving a load signal on its data input and said train of pulses on its toggle input and for providing said load signal on said output for each like transition of the base signal; and
    (b) a logic gate for receiving and for gating said train of pulses to said plurality of delay means as a function of the load signal at the output of said flip-flop.

* * * * *